US012512294B2

(12) United States Patent
Ootsuga et al.

(10) Patent No.: US 12,512,294 B2
(45) Date of Patent: Dec. 30, 2025

(54) CHARGED PARTICLE BEAM DEVICE

(71) Applicant: Hitachi High-Tech Corporation, Tokyo (JP)

(72) Inventors: Kazuo Ootsuga, Tokyo (JP); Kazufumi Yachi, Tokyo (JP); Makoto Sakakibara, Tokyo (JP); Heita Kimizuka, Tokyo (JP); Yusuke Abe, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 528 days.

(21) Appl. No.: 17/921,416

(22) PCT Filed: Jun. 18, 2020

(86) PCT No.: PCT/JP2020/023909

§ 371 (c)(1),
(2) Date: Oct. 26, 2022

(87) PCT Pub. No.: WO2021/255886

PCT Pub. Date: Dec. 23, 2021

(65) Prior Publication Data

US 2023/0064202 A1 Mar. 2, 2023

(51) Int. Cl.
*H01J 37/244* (2006.01)
*H01J 37/28* (2006.01)

(52) U.S. Cl.
CPC ............ *H01J 37/244* (2013.01); *H01J 37/28* (2013.01)

(58) Field of Classification Search
CPC .. H01J 37/00; H01J 37/02; H01J 37/26; H01J 37/28; H01J 37/244; H01J 2237/2443;
(Continued)

(56) References Cited

U.S. PATENT DOCUMENTS 5,548,121 A * 8/1996 Balmer .................. G01T 1/244 250/397
2002/0008201 A1 1/2002 Tanaka et al.
(Continued)

FOREIGN PATENT DOCUMENTS

JP 64-010561 A 1/1989
JP 10-289681 A 10/1998
(Continued)

OTHER PUBLICATIONS

International Search Report of PCT/JP2020/023909 dated Sep. 1, 2020.
(Continued)

*Primary Examiner* — Jason L Mccormack
(74) *Attorney, Agent, or Firm* — MATTINGLY & MALUR, PC

(57) ABSTRACT

A charged particle beam device includes: a stage 124 on which a sample 108 is to be placed; a charged particle optical system including a charged particle source 113 and an objective lens 121 that focuses a charged particle beam from the charged particle source onto the sample; and a detector 123 disposed between the objective lens and the stage and configured to detect electrons 109 emitted by an interaction between the charged particle beam and the sample. The stage, the charged particle optical system, and the detector are housed in a vacuum housing 112, and the detector includes a scintillator 107, a solid-state photomultiplier tube 104, and a light guide 106 provided between the scintillator and the solid-state photomultiplier tube, and an area of a light receiving surface of the scintillator is larger than an area of a light receiving surface of the solid-state photomultiplier tube.

10 Claims, 8 Drawing Sheets

(58) Field of Classification Search
CPC ... H01J 2237/24465; H01J 2237/24475; H01J 43/04
USPC .................................. 250/306, 307, 310, 311
See application file for complete search history.

(56) References Cited

U.S. PATENT DOCUMENTS

| | | | | |
|---|---|---|---|---|
| 2006/0076489 | A1 | 4/2006 | Ohshima et al. | |
| 2008/0315094 | A1 | 12/2008 | Wang et al. | |
| 2012/0037802 | A1 | 2/2012 | Kneedler | |
| 2012/0273677 | A1 | 11/2012 | Tuma et al. | |
| 2016/0170045 | A1 | 6/2016 | Kim et al. | |
| 2016/0322194 | A1* | 11/2016 | Kooijman | H01J 37/265 |
| 2019/0259571 | A1* | 8/2019 | Cheifetz | G01T 1/20 |
| 2020/0335299 | A1* | 10/2020 | Penny | H01J 37/244 |

FOREIGN PATENT DOCUMENTS

| | | | |
|---|---|---|---|
| JP | 2002-064127 | A | 2/2002 |
| JP | 2003-151482 | A | 5/2003 |
| JP | 2006-114225 | A | 4/2006 |
| JP | 2012-230902 | A | 11/2012 |
| JP | 2013-535800 | A | 9/2013 |
| JP | 2013-541799 | A | 11/2013 |
| JP | 2019-186112 | A | 10/2019 |
| WO | 2012/016198 | A2 | 2/2012 |

OTHER PUBLICATIONS

Korean Office Action received in corresponding Korean Application No. 10-2022-7040422 dated Nov. 15, 2024.

* cited by examiner

[FIG. 1]
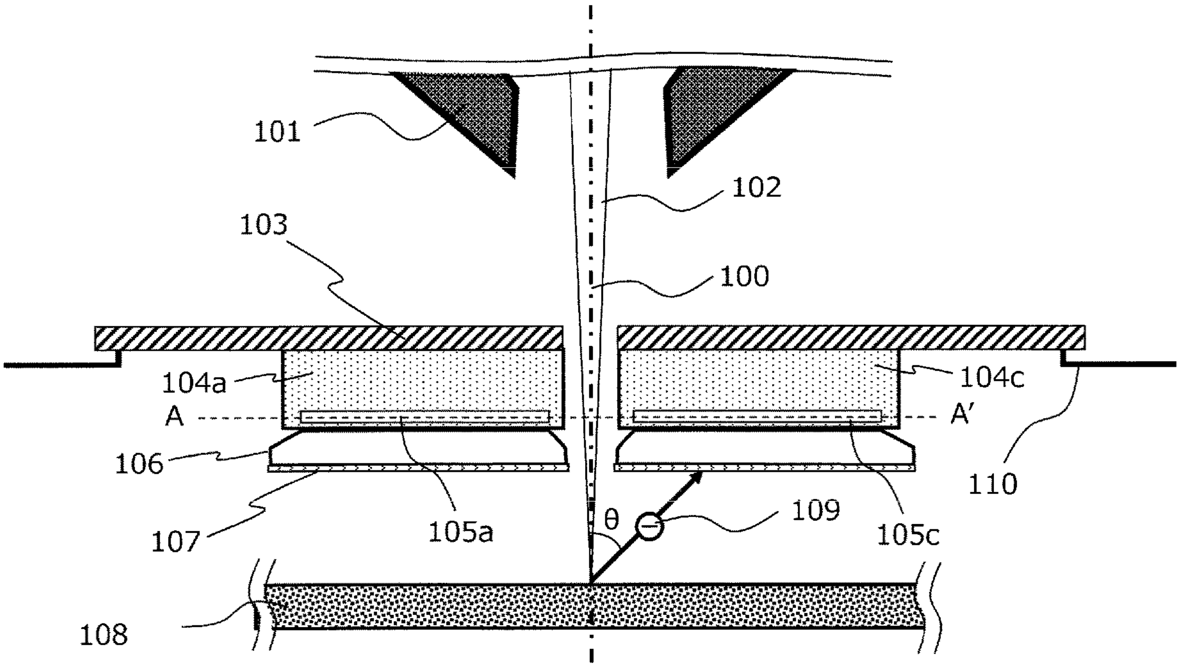

[FIG. 2]
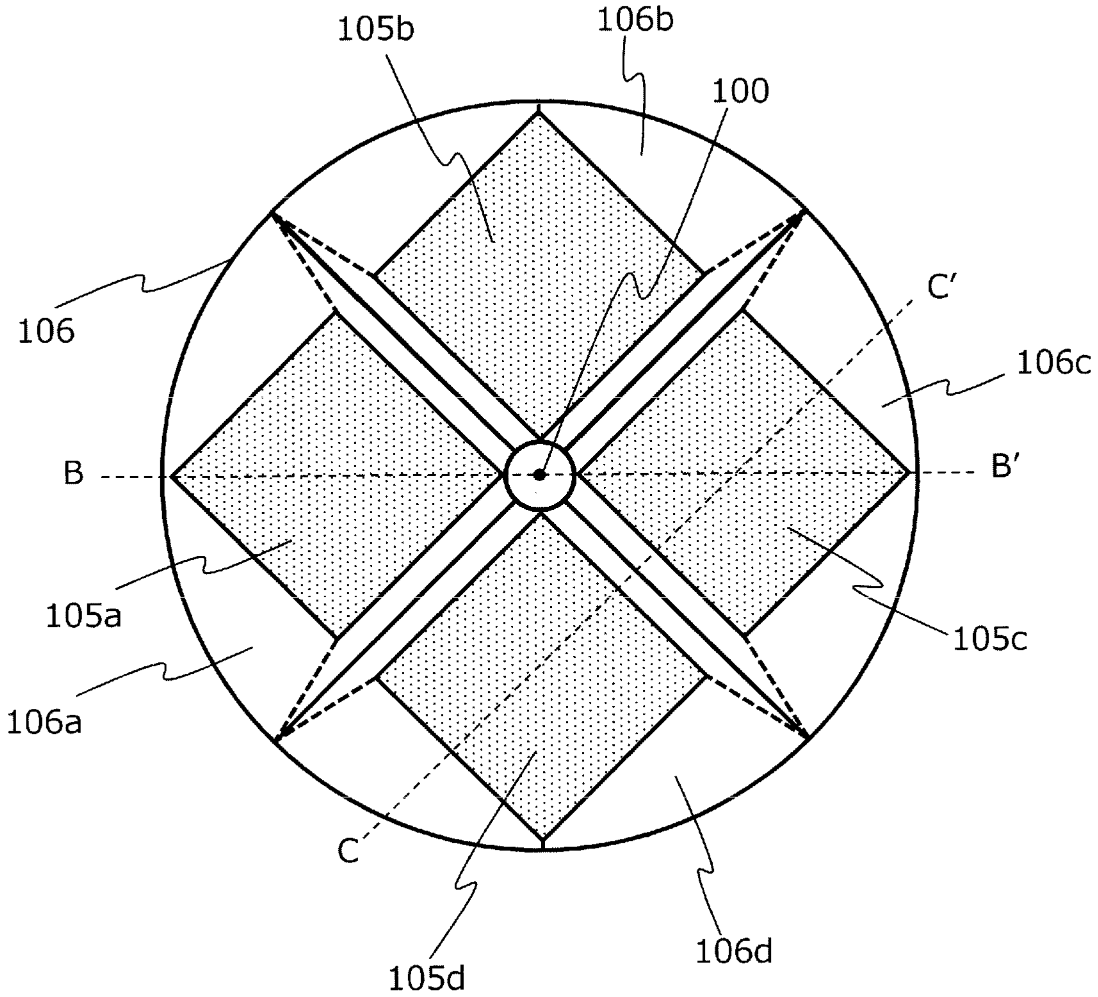
[FIG. 3]
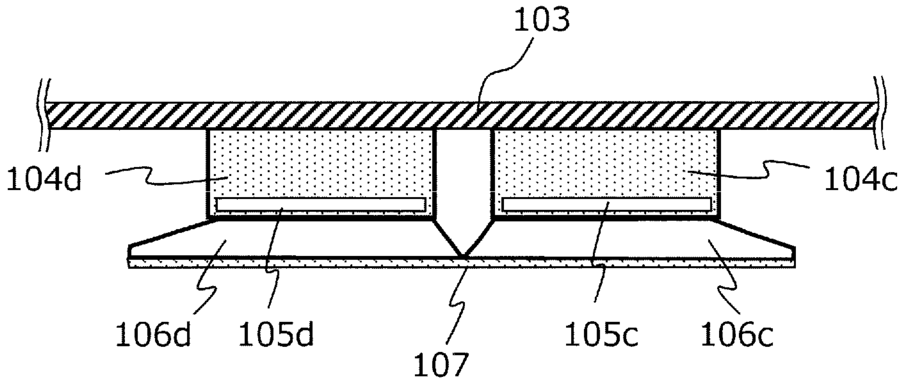

[FIG. 4]
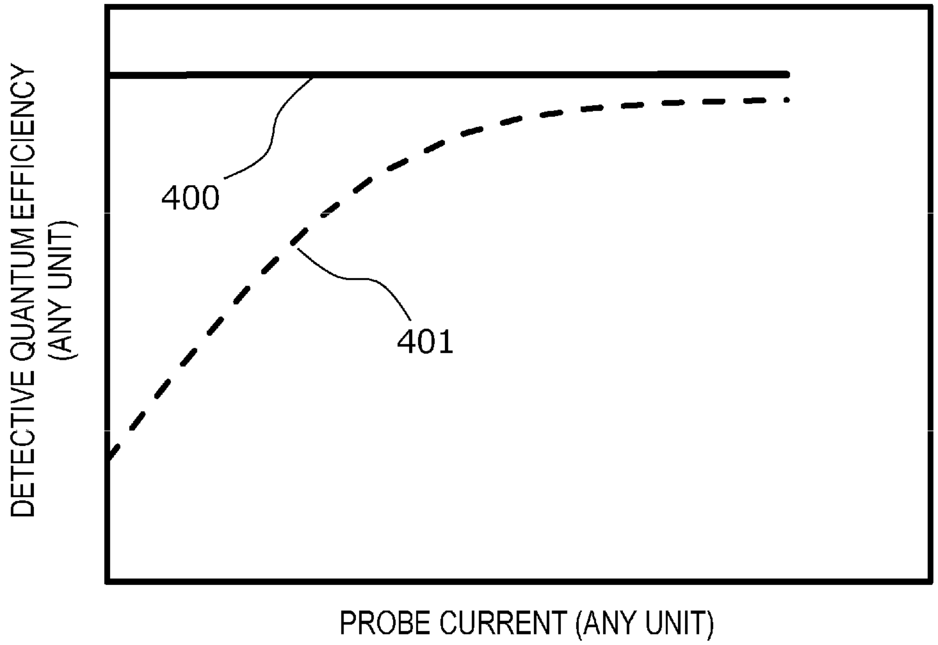
[FIG. 5]
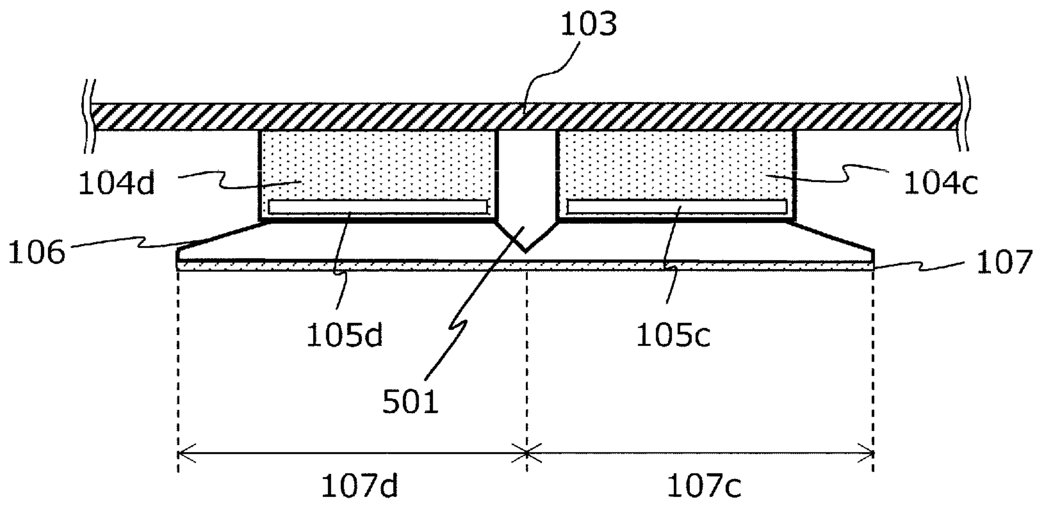

[FIG. 6]
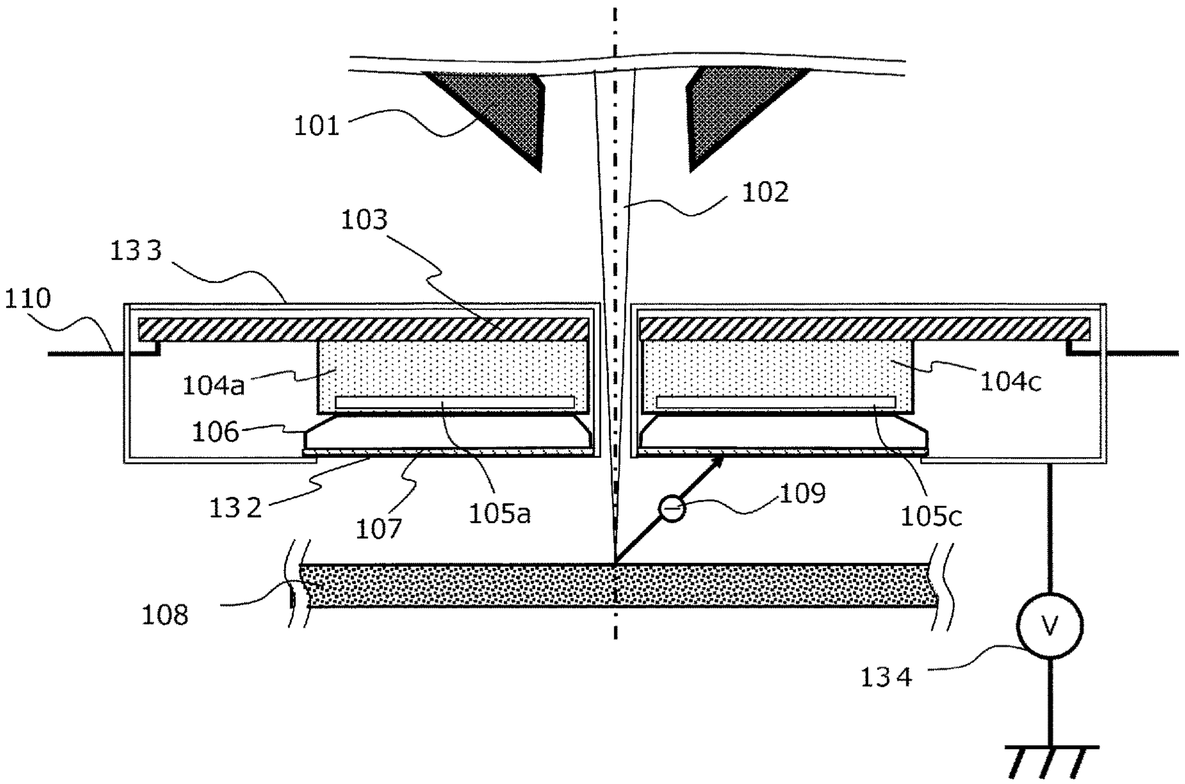

[FIG. 7]
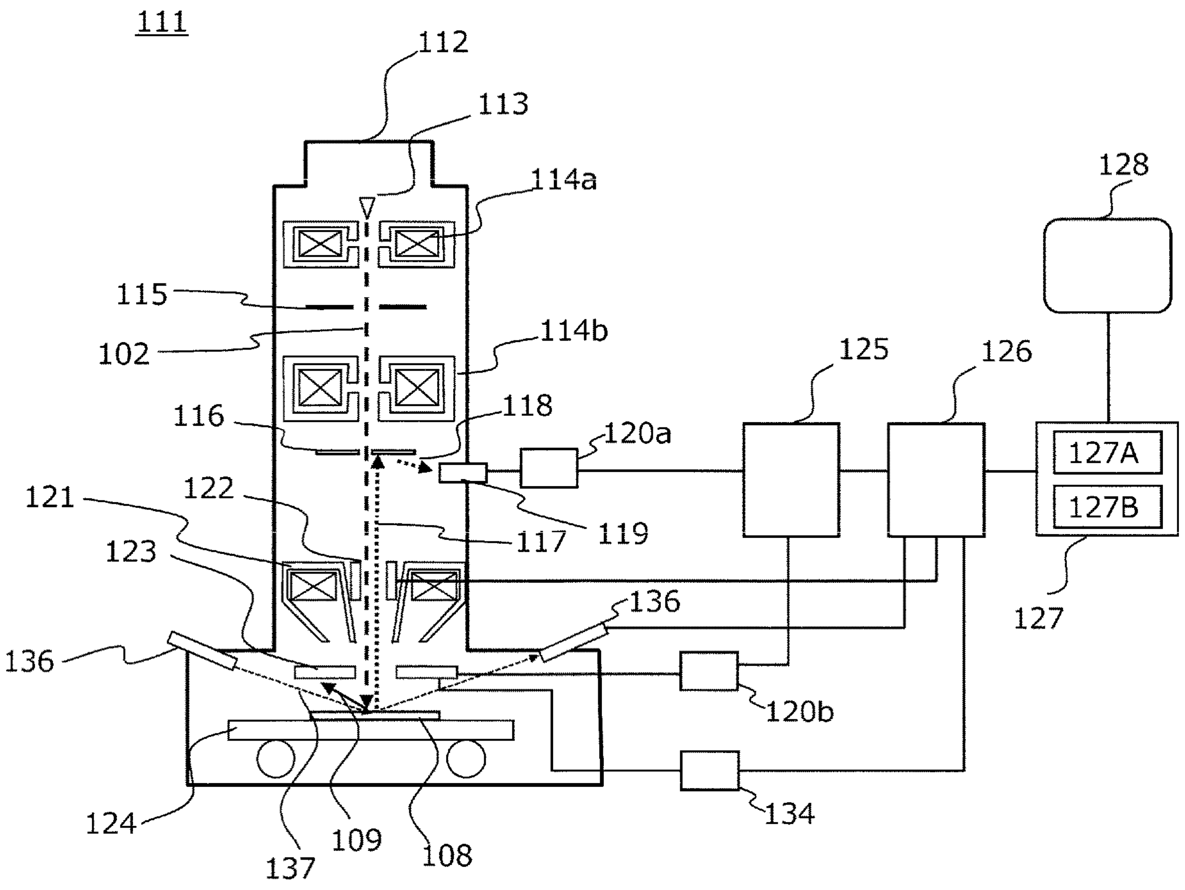

[FIG. 8]
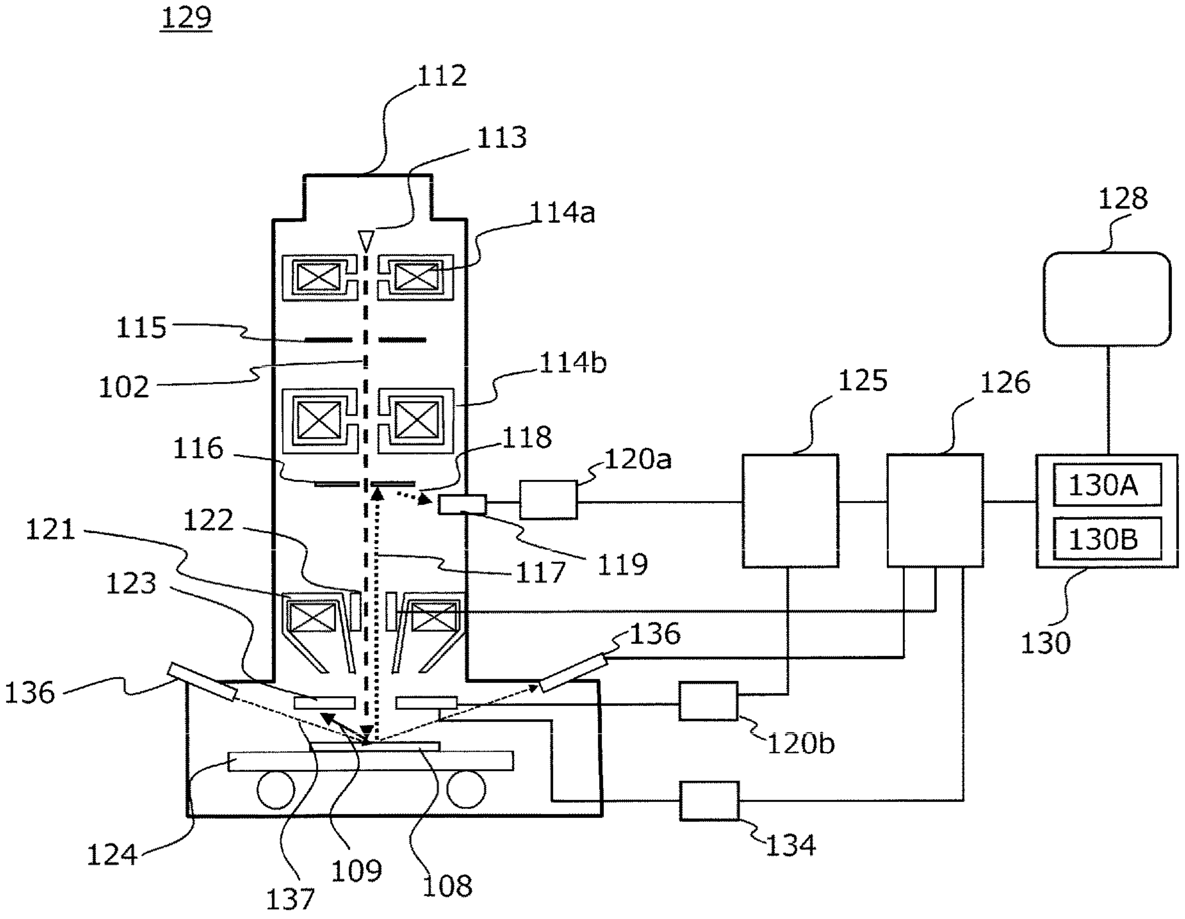
[FIG. 9A]
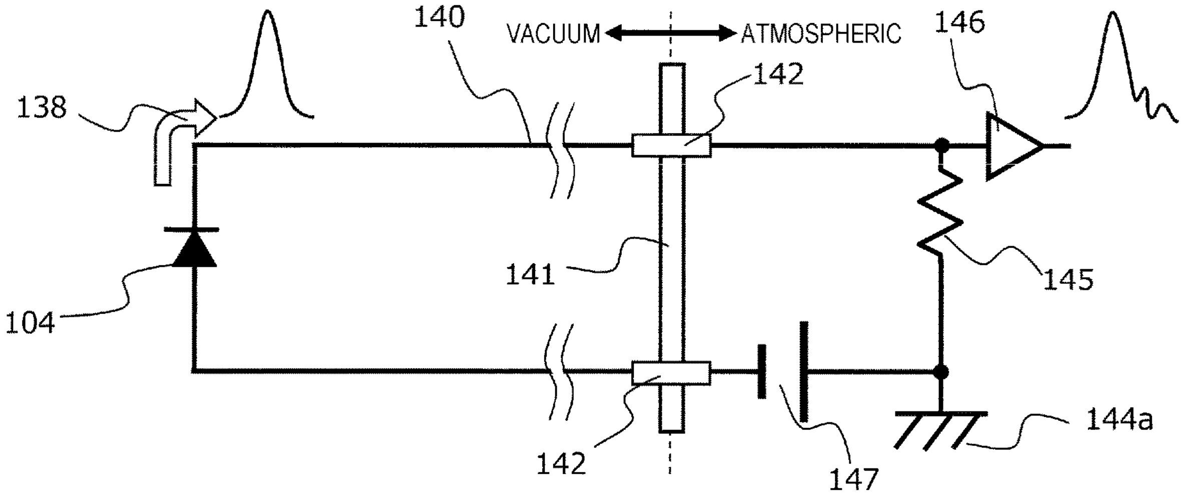

[FIG. 9B]
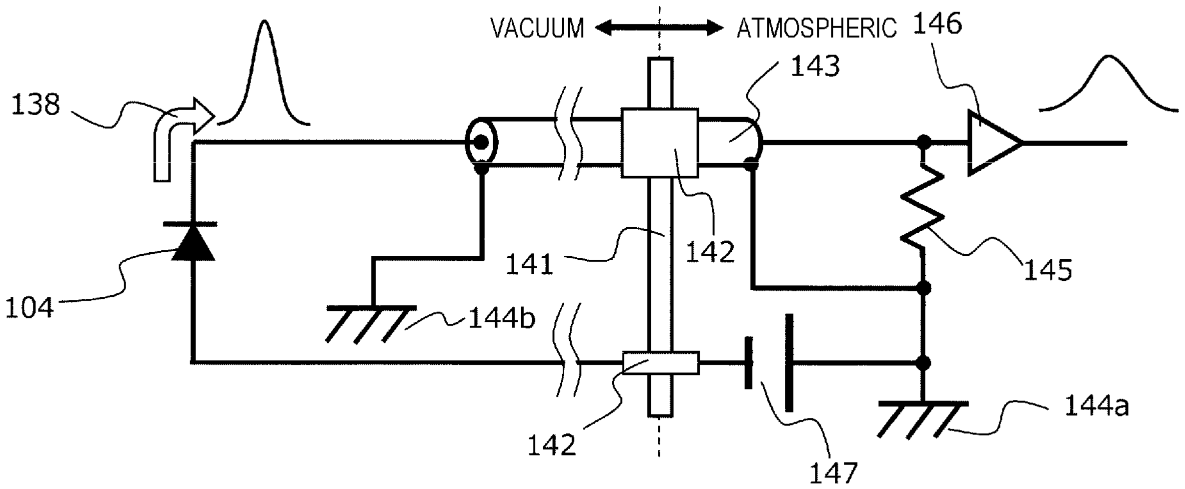
[FIG. 9C]
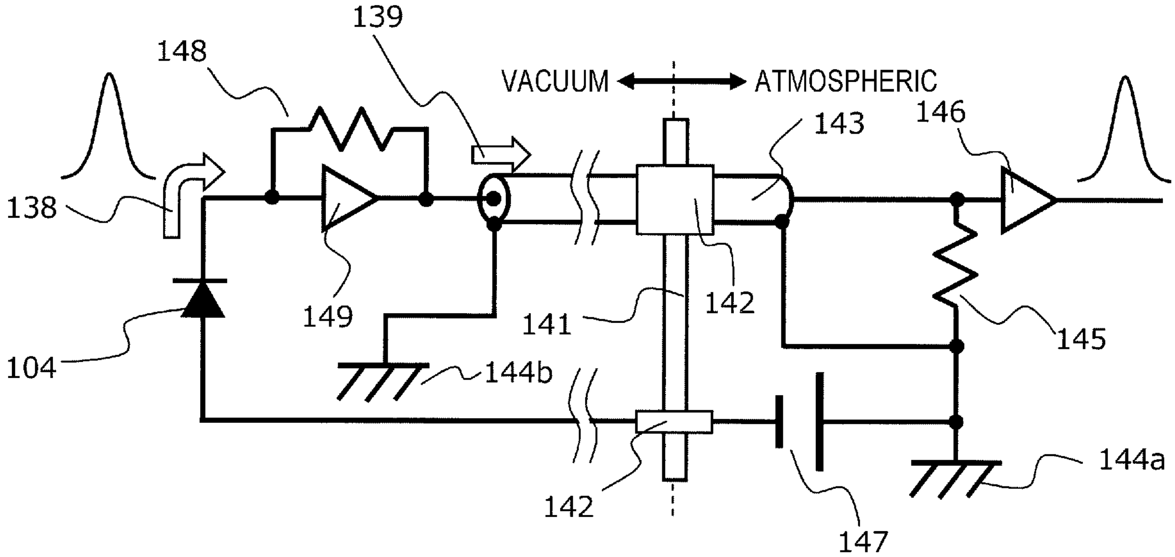

[FIG. 10]
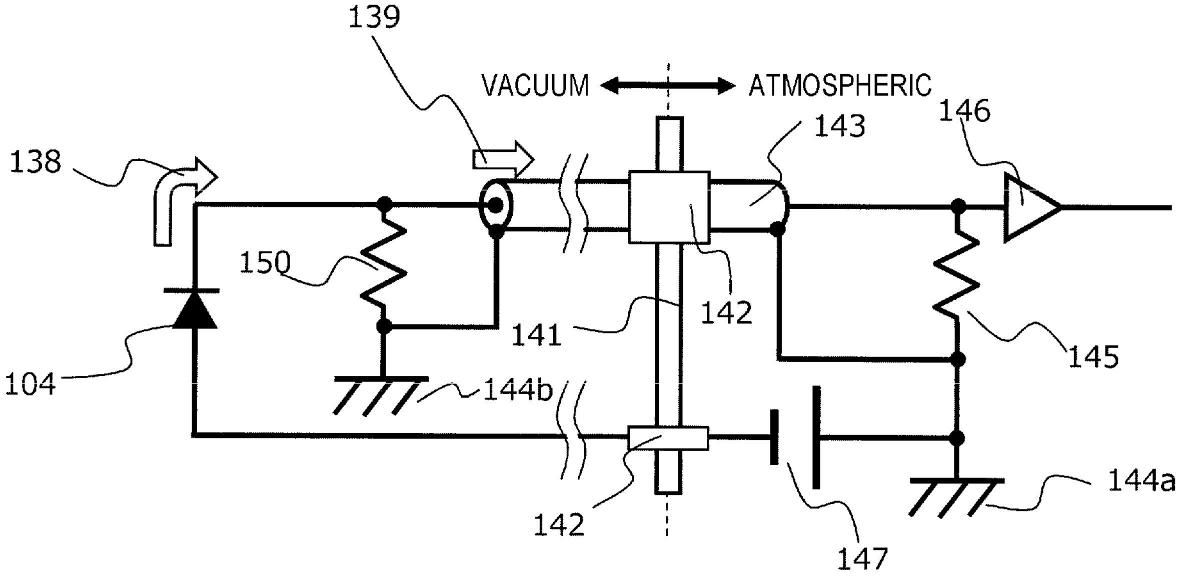
[FIG. 11]
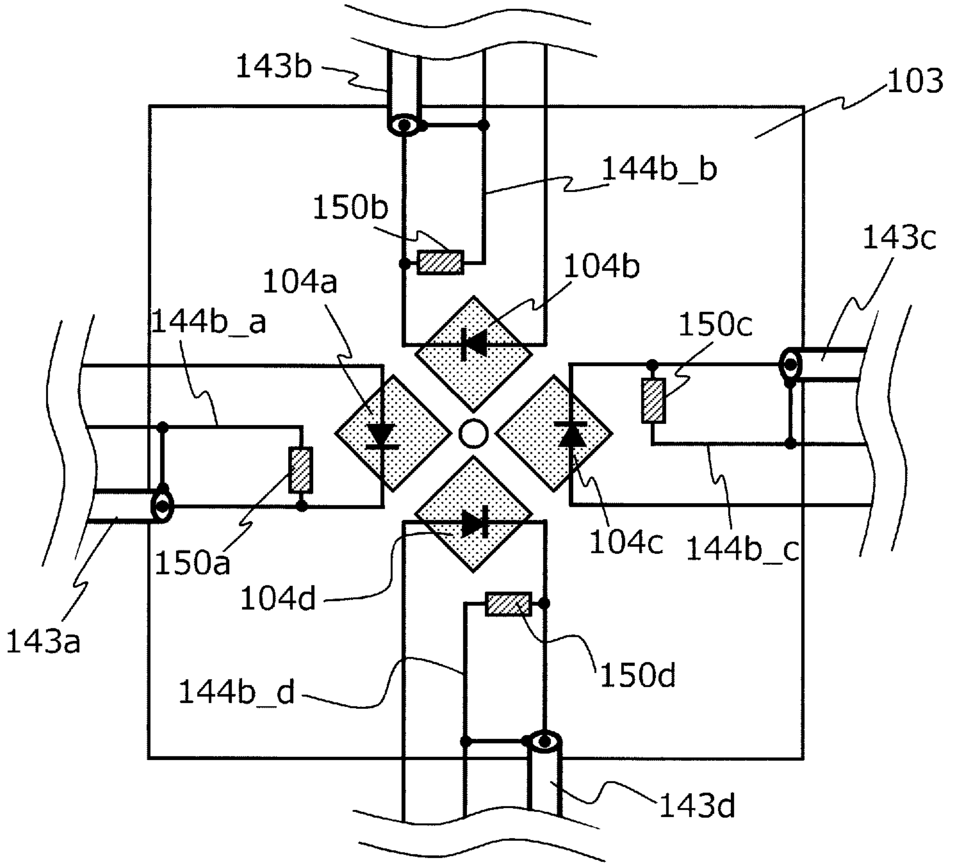

CHARGED PARTICLE BEAM DEVICE

TECHNICAL FIELD

The present invention relates to a charged particle beam device.

BACKGROUND ART

In a field of storage for storing digital data, a market size of a flash memory is expanding. The background for this is that the flash memory continuously reduces the cost per storage capacity (bit cost) by miniaturization and three-dimensionalization. A 3D NAND flash memory reduces the bit cost by vertically stacking memory cells, and includes 112 stacked layers of memory cells in a current most advanced device.

Process steps of the 3D NAND flash memory include a step of collectively processing holes (memory holes) having a high aspect ratio from an uppermost layer to a lowermost layer in a multilayer film in which plate-shaped electrode films and insulating films are alternately stacked and forming an insulating film and a floating gate film for accumulating charges on inner walls of the memory holes. Since the etching step of forming holes having a high aspect ratio in the multilayer film or the step of forming films on the inner walls of the memory holes is a highly difficult process step, it is desired to improve yield at an early stage by providing quick feedback on the quality of the process step through an in-line critical dimension measurement and a defect inspection.

The critical dimension measurement and the defect inspection are executed by a scanning electron microscope (SEM) which is one of charged particle beam devices. In order to observe a side surface or a bottom surface of a deep hole or a deep groove having a high aspect ratio as described above, it is suitable to use a back scattered electron (BSE) image obtained by irradiating a sample with a highly accelerated electron beam and detecting high energy BSEs (also referred to as reflected electrons) emitted from the side surface or the bottom surface of the deep hole or the deep groove. When a BSE detector is disposed between an objective lens and the sample, the BSE detector is subject to a spatial constraint that the objective lens and the sample are close to each other, and thus the BSE detector has a structural constraint.

PTL 1 discloses a thin BSE detector that can be disposed between an objective lens and a sample even under a severe spatial constraint. The BSE detector is implemented by a scintillator-silicon photomultiplier (SiPM) coupled pair assembly. In the assembly, a rear surface of the scintillator is directly bonded to a light sensitive surface of the SiPM by a light transmissive adhesive. Due to the direct face-to-face contact between the SiPM and the scintillator, bonding of a scintillator and a light guide, which is necessary for an ET detector in the related art to transfer light from the scintillator to a photomultiplier tube (PMT) disposed outside a vacuum chamber, becomes unnecessary. As a result, light from the scintillator is efficiently transmitted to the SiPM.

PTL 2 discloses a photosensor system in positron emission tomography (PET). Light generated by collision of γ-rays or photons with a scintillator block is detected by a photosensor such as a SiPM. The scintillator block and the photosensor are connected by a light guide. The light guide has a cross section closer to the scintillator block larger than a cross section closer to the photosensor.

CITATION LIST

Patent Literature

PTL 1: JP-T-2013-541799

PTL 2: US Patent Application Publication No. 2016/0170045

SUMMARY OF INVENTION

Technical Problem

In the BSE detector disclosed in PTL 1, since the scintillator and the SiPM are brought into direct contact with each other, light from the scintillator can be efficiently propagated to the SiPM. However, since a size of the scintillator is constrained by a size of the SiPM, it is expected that the ratio of BSEs that are not detected is large because the BSEs do not collide with the scintillator even though the BSEs are emitted from the sample, resulting in a decrease in detection efficiency. In this case, if a light receiving surface of the SiPM is increased, the scintillator can also be increased in size, and thus it is considered that the decrease in the detection efficiency due to the size of the scintillator can be prevented.

However, when the light receiving surface of the SiPM is increased, an output parasitic capacitance of the SiPM increases (the output parasitic capacitance increases in proportion to a light receiving area). For this reason, a circuit noise of a circuit for processing output signals from the SiPM increases, and when the sample is scanned by a charged particle beam at a high speed, it is difficult to detect BSEs following the scanning speed of the charged particle beam due to a response delay of the detector.

Therefore, it is desired that, in a BSE detector mounted on a charged particle beam device, a light receiving surface of a scintillator is as large as possible while a size of a light receiving surface of a SiPM is limited to a size compatible to response characteristics of a detection circuit. An object of the invention is to implement a charged particle beam device including a BSE detector that is suitable for observation of a deep hole or a deep groove having a high aspect ratio and has high detection quantum efficiency.

PTL 2 discloses the photosensor system used for PET. The photosensor system is significantly different from the BSE detector according to the invention in terms of usage and size, but has similarities in a shape of the light guide, and thus PTL 2 is quoted. A reason why the light guide has a cross section closer to the scintillator block larger than a cross section closer to the photosensor may be that although a direct contact without a light guide is possible, the use of such a shaped light guide can reduce the area and number of photosensors, leading to cost reduction.

Solution to Problem

A charged particle beam device according to an embodiment of the invention includes: a stage on which a sample is to be placed; a charged particle optical system including a charged particle source and an objective lens configured to focus a charged particle beam from the charged particle source onto the sample; and a detector disposed between the objective lens and the stage and configured to detect electrons emitted by an interaction between the charged particle beam and the sample. The stage, the charged particle optical system, and the detector are housed in a vacuum housing, and the detector includes a scintillator, a solid-state photomultiplier tube, and a light guide provided between the scintillator and the solid-state photomultiplier tube, and an area of a light receiving surface of the scintillator is larger than an area of a light receiving surface of the solid-state photomultiplier tube.

Advantageous Effects of Invention

A charged particle beam device including a BSE detector that is suitable for observation of a deep hole or a deep groove having a high aspect ratio is provided.

Other problems and novel characteristics will become apparent from the description of this specification and the drawings.

BRIEF DESCRIPTION OF DRAWINGS

FIG. 1 is a schematic configuration diagram of a BSE detector.

FIG. 2 is a top view of the BSE detector taken along an A-A' section in FIG. 1.

FIG. 3 is a longitudinal cross-sectional view of the BSE detector taken along a C-C' section in FIG. 2.

FIG. 4 is a diagram illustrating a detection characteristic of the BSE detector.

FIG. 5 is a longitudinal cross-sectional view of the BSE detector (modification) taken along the C-C' section in FIG. 2.

FIG. 6 is a diagram illustrating a method for mounting the BSE detector on a charged particle beam device.

FIG. 7 is a schematic configuration diagram of a semiconductor inspection device.

FIG. 8 is a schematic configuration diagram of a semiconductor measurement device.

FIG. 9A is a circuit diagram of a signal transmission circuit (Comparative Example 1).

FIG. 9B is a circuit diagram of a signal transmission circuit (Comparative Example 2).

FIG. 9C is a circuit diagram of a signal transmission circuit (Comparative Example 3).

FIG. 10 is a circuit diagram of a signal transmission circuit (embodiment).

FIG. 11 is a diagram illustrating an example of mounting a signal transmission circuit on a circuit board.

DESCRIPTION OF EMBODIMENTS

Hereinafter, an embodiment of the invention will be described with reference to the drawings.

FIG. 1 is a schematic configuration diagram of a BSE detector according to the present embodiment. FIG. 1 is a longitudinal cross-sectional view taking a plane including a central axis 100 of the BSE detector as a cross section. The BSE detector aims to detect back scattered electrons (BSEs) 109 emitted by irradiating a sample 108 with an electron beam 102, and is disposed between a pole piece 101 of an objective lens and the sample 108. The BSE detector according to the present embodiment includes a scintillator 107, a light guide 106, a silicon photomultiplier (SiPM, a solid-state photomultiplier tube, or a multi-pixel photon counter (MPPC)) 104, and a circuit board 103. When the BSEs 109 collide with the scintillator 107, kinetic energy thereof is converted into light, and the converted light is propagated to a light receiving surface 105 of the SiPM 104 by the light guide 106. The SiPM 104 converts the received light into a current signal, the current signal is converted into a voltage signal in the circuit board 103, and the converted voltage signal is output as a detection signal through a wiring 110.

A principle of signal electron detection by the BSE detector according to the present embodiment is the same as that of an everhart thornley (ET) detector widely used for secondary electron detection in a charged particle beam device. However, in the ET detector used for secondary electron detection, only a scintillator is disposed in a housing of the charged particle beam device which is evacuated, and converted light is propagated to a photomultiplier tube (PMT) disposed in the atmosphere by a light guide. In contrast, in the present embodiment, since the SiPM has a compact shape and can be installed in a vacuum and a magnetic field, the SiPM is used for detecting light from the scintillator, so that the BSE detector including the SiPM for detecting light can be disposed in a vacuum environment between the pole piece 101 and the sample 108.

FIG. 2 is a top view of the BSE detector taken along an A-A' section illustrated in FIG. 1. FIG. 1 corresponds to a longitudinal cross-sectional view taken along a B-B' section in FIG. 2. FIG. 3 illustrates a longitudinal cross-sectional view taken along a C-C' section in FIG. 2.

As illustrated in FIG. 2, a shape of the light guide 106 in the top view is a circular shape, and a central hole is provided at a center of the light guide 106 for primary electrons to be emitted to the sample or secondary electrons emitted from the sample to pass therethrough. The scintillator 107 is provided to cover a lower surface (a surface facing the sample 108) of the light guide 106. That is, the lower surface of the light guide 106 serves as a light receiving surface of the scintillator 107. A size of the light receiving surface of the scintillator 107 (=the lower surface of the light guide 106) is determined based on a detection range θ of target BSEs (see FIG. 1, defined as an angle between a trajectory of the BSEs 109 emitted from an intersection of the central axis 100 and the sample 108 and the central axis 100), and a distance between the BSE detector and the sample 108. A center of the central hole is the central axis 100.

The BSE detector shown in this example is a four-channel detector, and is provided with four SiPMs. Light receiving surfaces of the four SiPMs are arranged rotationally symmetrically with the central axis 100 as a rotation axis on an upper surface of the light guide 106 in contact with the SiPM 104. Since the BSEs have high energy and are incident on the scintillator almost straight from a point where the BSEs are emitted, by separating the light receiving surface of the scintillator into a plurality of channels, it is possible to obtain more information such as a composition image of the sample by adding up detection signals obtained from each channel, or an image in which a three-dimensional shape of the sample is emphasized by subtraction.

Therefore, the light guide 106 is implemented by combining partial light guides 106*a* to 106*d* each corresponding to a quarter region in the top view. Light from the scintillator 107 propagated to the partial light guides 106*a* to 106*d* is propagated toward light receiving surfaces 105*a* to 105*d* of SiPMs 104*a* to 104*d*, respectively. The number of channels is not limited to four, and the light guide 106 may be implemented by providing SiPMs according to the number of channels and assembling partial light guides having a shape divided according to the number of channels.

The light guide 106 has the following characteristics to minimize light propagation loss caused by the light guide 106. The light receiving surface of the scintillator 107 is substantially parallel to the light receiving surface 105 of the SiPM 104. Here, the term "substantially parallel" means that a deviation from strict parallelism is allowed as long as the deviation is within a tolerance determined in a manufacturing process. In addition, by reducing a thickness of the light guide 106, that is, by shortening a distance between the light receiving surface of the SiPM 104 and the light receiving surface of the scintillator 107, an optical path length can be shortened and the amount of light absorbed by the light guide 106 can be reduced. The shape of the upper surface of the light guide 106 is made the same as a shape of the light receiving surface 105 of the SiPM 104 that faces the light guide 106, and the lower surface of the light guide 106 and the upper surface of the light guide 106 are connected to each other by an inclined side surface so that the light guide 106 has a tapered shape. Since the light guide 106 has a tapered shape, light from the scintillator 107 is focused on the light receiving surface 105 of the SiPM 104 while being reflected by the side surface of the light guide, whereby the light propagation loss can be reduced. As a material for the light guide 106, synthetic quartz, acrylic (poly methyl methacrylate (PMMA)), borosilicate glass, or the like can be used.

The scintillator 107 may be formed by a disk-shaped single crystal scintillator that matches the shape of the lower surface of the light guide 106, or by coating the lower surface of the light guide 106 with powder scintillator.

FIG. 4 illustrates a detection characteristic of the BSE detector according to the present embodiment. A horizontal axis indicates a probe current (any unit), a vertical axis indicates detective quantum efficiency (DQE, any unit), and both the axes are on a logarithmic scale. The DQE represents the ratio of $(S/N)^2$ of an input signal to $(S/N)^2$ of a detected signal, and the DQE is 1 in the case of an ideal detector. A waveform 400 indicates DQE of the BSE detector according to the present embodiment, and a waveform 401 indicates DQE of a BSE detector using a semiconductor detector widely used as a BSE detector disposed below an objective lens. Simulations were executed under the same conditions except for the detector. The semiconductor detector ionizes atoms with kinetic energy of signal electrons incident on the semiconductor detector, and outputs generated carriers (electron-hole pairs) as electrical signals. Therefore, the semiconductor detector has a detector gain smaller than that of the ET detector employed by the BSE detector according to the present embodiment. Therefore, the semiconductor detector is likely to be influenced by a circuit noise, and in particular, in a measurement in a state in which S/N of an input signal is low due to a small probe current, S/N of a detected signal is significantly lowered. In contrast, in the BSE detector according to the present embodiment, a stable detection characteristic can be achieved regardless of the magnitude of the probe current.

FIG. 5 illustrates a modification of the BSE detector according to the present embodiment. In the BSE detector described above, the light guide 106 is implemented by combining the partial light guides 106*a* to 106*d* for each channel, whereas in the present modification, the light guide 106 is formed integrally with light guides for each channel. FIG. 5 illustrates a longitudinal cross-sectional view corresponding to the C-C' section in FIG. 2 in the modification. Thus, the BSE detector according to the modification is different from the BSE detector described above in that the light guide 106 is separated into the light guides for each channel by grooves 501 such as V-shaped grooves.

In the BSE detector according to the modification, the light guides are not separated for each channel on the lower surface of the light guide 106. Therefore, crosstalk between channels may occur when light converted by the partial light receiving surface 107*d* of the scintillator 107 is received by, for example, the SiPM 104*c*, or light converted by the partial light receiving surface 107*c* of the scintillator 107 is received by, for example, the SiPM 104*d*. However, the crosstalk can be prevented by making thicknesses of the light guide portions that are not separated for each channel as small as possible, and an assembling step considering preventing mutual positional deviation between the partial light guides, which is necessary in the case of the above configuration, can be eliminated. Also in the BSE detector according to the modification, the number of channels is any number.

A method for mounting the BSE detector according to the present embodiment on a charged particle beam device will be described with reference to FIG. 6. The scintillator 107 is charged by a large amount of incident high-energy BSEs, and detection performance is deteriorated. Therefore, a surface of the scintillator 107 is coated with a conductive material 132. As the conductive material 132, for example, an aluminum deposition film or an ITO film may be used. When the surface of the scintillator 107 is coated with the conductive material 132, there is also an effect that light converted by the scintillator 107 is reflected to a SiPM side and the light propagation efficiency is increased.

The BSE detector is housed in a conductive housing 133. The housing 133 exposes the light receiving surface of the scintillator from an opening provided on a lower surface (a surface on a sample side) while covering an outer periphery including the central hole of the BSE detector. The housing 133 and the conductive material 132 provided on the surface of the scintillator 107 are electrically connected by bringing the housing 133 and the conductive material 132 into contact with each other. As a material of the housing 133, a non-magnetic metal may be used, and for example, Al, Ti, Cu, and stainless steel may be used.

The charging of the scintillator 107 is eliminated by discharging charges to a ground potential through the conductive material 132 and the housing 133. Therefore, if the purpose is to eliminate the charging of the scintillator 107, the housing 133 may be connected to the ground potential, whereas in the aspect illustrated in FIG. 6, the housing 133 is provided with a housing potential setting power supply 134 so that a potential of the housing 133 can be controlled. This is because of the following reason.

In the charged particle beam device, in order to obtain an image having a high resolution, it is necessary to control a spot diameter of the electron beam 102 to be minimum on a surface of the sample 108. Since the surface of the sample 108 has micro unevenness and a global height deviation in a sample plane, focus adjustment is necessary for each observation field of view. The focus adjustment is generally executed by controlling an excitation current of the objective lens, but this takes time. In the configuration illustrated in FIG. 6, by controlling a potential to be applied to the housing 133 by the housing potential setting power supply 134, the focus adjustment can be executed by a generated electrostatic field. Since control of the electrostatic field can be executed at a higher speed than control of a magnetic field, there is an effect of shortening time required for the focus adjustment and increasing throughput of an inspection and measurement.

FIG. 7 illustrates a schematic configuration of a semiconductor inspection device as an example of a charged particle beam device equipped with the BSE detector according to the present embodiment. Here, an example of a semiconductor inspection device having a defect review function will be described as the semiconductor inspection device.

A semiconductor inspection device 111 includes an electron optical system and a detection system built in a vacuum housing 112. The electron optical system mainly includes an electron source 113, two condenser lenses 114*a* and 114*b*, a diaphragm 115, a deflector 122, and a semi-in-lens type objective lens 121. The electron beam 102 emitted from the electron source 113 is adjusted by the two condenser lenses 114*a* and 114*b* and the objective lens 121 to be focused on the surface of the sample 108 placed on a stage 124, and executes scanning on the sample by the deflector 122.

When the electron beam 102 from the electron optical system is emitted to the sample 108, secondary electrons and BSEs are emitted from the sample 108 due to an interaction between the electron beam and the sample. The detection system includes a secondary electron detector 119 that mainly detects the secondary electrons, and a BSE detector 123 that mainly detects the BSEs. The secondary electron detector 119 is a through the lens (TTL) detector, and detects secondary electrons 118 obtained by reflecting secondary electrons 117 by a reflection plate 116. The secondary electrons 117 are emitted from the sample 108, drawn up by a leakage magnetic field of the objective lens 121, and guided upward along an optical axis. Meanwhile, the BSE detector 123 is disposed between the objective lens 121 and the stage 124, and directly detects the BSEs 109 emitted from the sample 108. In the present embodiment, a BSE detector having the configuration described above is used as the BSE detector 123.

A detection signal from the secondary electron detector 119 is amplified by a signal amplifier 120*a*, and a detection signal from the BSE detector 123 is amplified by a signal amplifier 120*b*. An analog-to-digital conversion circuit 125 selects signals from the two signal amplifiers 120, and converts the analog signals from the signal amplifier circuits into digital signals. A control device 126 controls each mechanism of the electron optical system and the detection system, receives the digital signals from the analog-digital conversion circuit 125, and generates an image based on the input digital signals and irradiation position information on the electron beam 102.

Further, in this example, a sample height sensor 136 is provided to detect a height of the sample 108 irradiated with the electron beam 102. The sample height sensor 136 irradiates the sample 108 with laser light 137, and detects the height of the sample based on an intensity of the reflected laser light. The intensity of the laser light detected by the sample height sensor 136 is input to the control device 126 to calculate the height of the sample 108. The control device 126 determines a potential of a housing of the BSE detector 123 according to the calculated height of the sample 108, and applies a predetermined voltage to the housing of the BSE detector 123 by the housing potential setting power supply 134 such that the electron beam 102 focuses on the surface of the sample 108. Focus adjustment may also be executed without the sample height sensor 136 by, for example, searching for an optimum position by imaging while shifting a focus position.

An inspection by the semiconductor inspection device 111 is controlled by an inspection control device 127. The image generated by the control device 126 is input to the inspection control device 127, and image processing and analysis processing are executed by the inspection control device 127. The inspection control device 127 includes, for example, a defect analysis unit 127A and a 2D contour calculation unit 127B. The defect analysis unit 127A executes an automatic defect review (ADR) function or an automatic defect classification (ADC) function. The ADR function is a function of observing, classifying, and analyzing a shape, a component, and the like of a detected foreign matter, defect, and the like in more detail by automatically acquiring a target defect image based on defect information (coordinates or the like) acquired by the inspection device, storing data, and creating a database. The ADC function is a function of classifying defect images stored in an image server according to defect occurrence causes through classification software based on a predetermined rule, and re-storing the defect images in the image server. The classified information is uploaded to a yield management system or a host computer of a factory, and is used for investigating or analyzing the defect occurrence causes. The 2D contour calculation unit 127B extracts a 2D contour of a pattern formed on the sample 108, detects a difference from a design layout pattern, and executes an inspection for checking whether a lithography step is correctly performed. A display device 128 is connected to the inspection control device 127, and a GUI for setting an inspection content and displaying an inspection result is displayed. By using the BSE detector according to the present embodiment as the BSE detector 123, the S/N of the detection signal can be improved, and the throughput of the semiconductor inspection device can be improved.

FIG. 8 illustrates a schematic configuration of a semiconductor measurement device as an example of another charged particle beam device equipped with the BSE detector according to the present embodiment. Components common to those of the semiconductor inspection device illustrated in FIG. 7 are denoted by the same reference numerals, and redundant descriptions thereof will be omitted.

An inspection by a semiconductor measurement device 129 is controlled by a measurement control device 130, an image generated by the control device 126 is input to a measurement control device 130, and image processing and measurement processing are executed by the measurement control device 130. The measurement control device 130 includes, for example, a dimension measurement unit 130A and an inter-pattern matching measurement unit 130B. The dimension measurement unit 130A measures a width and the like of the pattern formed on the sample 108. By irradiating the sample with a highly accelerated electron beam and detecting BSEs generated from a bottom of a deep hole or a deep groove by the BSE detector according to the present embodiment, an improvement in dimensional measurement accuracy of the bottom of the deep hole or the deep groove can be expected. The inter-pattern matching measurement unit 130B executes an alignment deviation measurement (an overlay measurement) between upper and lower layers. The upper layer pattern is observed by a secondary electron image detected by the secondary electron detector 119, and the lower layer pattern is observed by a BSE image detected by the BSE detector 123, and the presence or absence of alignment deviation between the upper and lower layers can be detected by collating the two images. The display device 128 is connected to the measurement control device 130, and a GUI for setting a measurement content and displaying a measurement result is displayed. In this example as well, by using the BSE detector according to the present embodiment as the BSE detector 123, the S/N of the detection signal can be improved, and the throughput of the semiconductor measurement device can be improved.

In the BSE detector according to the present embodiment, since the SiPM is disposed in a vacuum housing, it is necessary to transmit the current signal output from the SiPM to a signal processing circuit (the signal amplifier circuit or the like) disposed in the atmosphere outside the vacuum housing. Since deterioration of the signal due to long-distance transmission finally leads to deterioration of the detection characteristic of the BSE detector, it is necessary to minimize the deterioration of the signal due to the long-distance transmission. Hereinafter, a method for transmitting the detection signal of the SiPM in the present embodiment will be described.

First, FIGS. 9A to 9C illustrate signal transmission circuits according to comparative examples. In circuit diagrams in the following description, the SiPM 104 is expressed as a diode. In a charged particle beam device, in order to maintain airtightness, the wiring connecting the inside and outside of the housing is implemented through a feedthrough 142 provided on a vacuum flange 141 attached to the vacuum housing. In the circuit diagram, in order to clearly show a circuit installed in a vacuum environment and a circuit installed in an atmospheric environment, the vacuum flange 141 and the feedthrough 142 are displayed, and the vacuum flange 141 and the feedthrough 142 are electrically insulated from the signal transmission circuit and do not function as a circuit.

A circuit configuration common to the signal transmission circuits according to the comparative examples and a signal transmission circuit according to the embodiment to be described later are as follows. A bias voltage is applied from a bias power supply 147 disposed in the atmospheric environment to the SiPM 104 disposed in the vacuum environment. A ground potential 144*a* in the atmospheric environment and a ground potential 144*b* in the vacuum environment are connected to each other (not illustrated), and have the same potential. Circuit configuration components commonly used in the signal transmission circuits according to the comparative examples and the signal transmission circuit according to the embodiment are denoted by the same reference numerals, and redundant descriptions thereof will be omitted.

In the signal transmission circuit according to Comparative Example 1 illustrated in FIG. 9A, a current signal 138 from the SiPM 104 is transmitted as it is to a signal processing circuit (here, represented by an amplifier 146) in the atmospheric environment by a wiring 140. The current signal 138 is converted into a voltage signal by an input resistor 145 connected between the wiring 140 and the ground potential 144*a*, and is amplified by the amplifier 146. In Comparative Example 1, due to a mismatch between a characteristic impedance of the wiring 140 and an impedance of the input resistor 145 serving as a load, reflection occurs, ringing occurs in a detection signal, and waveform accuracy of the detection signal decreases.

In the signal transmission circuit according to Comparative Example 2 illustrated in FIG. 9B, the current signal 138 from the SiPM 104 is transmitted to a signal processing circuit by a coaxial wiring 143. By matching a characteristic impedance of the coaxial wiring 143 with an impedance of the input resistor 145 serving as a load, occurrence of reflection can be prevented, and occurrence of ringing in a detection signal can be eliminated. However, due to an influence of an electrical capacitance of the coaxial wiring 143, blunting of a detection signal occurs, and thus a response speed of the detection signal decreases.

In the signal transmission circuit according to Comparative Example 3 illustrated in FIG. 9C, the current signal 138 from the SiPM 104 is converted into a voltage signal 139 by a transimpedance amplifier 148, and the converted voltage signal 139 is transmitted to a signal processing circuit by the coaxial wiring 143. By transmitting the voltage signal 139 through the coaxial wiring 143, the influence of the electrical capacitance of the coaxial wiring 143 disappears, and waveform accuracy and a response speed of a detection signal can be improved with respect to Comparative Examples 1 and 2.

However, in the configuration according to Comparative Example 3 using the transimpedance amplifier 148, an operational amplifier 149 is mounted on the circuit board 103 of the BSE detector. Since the BSE detector is disposed in the vicinity of a sample, the degree of vacuum tends to decrease in the vicinity of the BSE detector due to degassing from the sample. In the signal transmission circuit according to Comparative Example 3, when the operational amplifier 149 generates Joule heat, the degassing amount may be further increased, and the degree of vacuum may be further decreased.

Based on the above description, the signal transmission circuit according to the present embodiment is illustrated in FIG. 10. In the present embodiment, the current signal 138 from the SiPM 104 is converted into the voltage signal 139, and the converted voltage signal 139 is transmitted to a signal processing circuit via the coaxial wiring 143. A characteristic impedance of the coaxial wiring 143 and an impedance of the input resistor 145 serving as a load are matched. In particular, it is characterized in that the conversion from the current signal 138 to the voltage signal 139 is executed by a parallel impedance of an impedance of a shunt resistor 150 serving as a passive element and the characteristic impedance of the coaxial wiring 143. The shunt resistor 150 is connected between an output terminal of the SiPM 104 and the ground potential 144*b*. By executing the current-voltage conversion using the shunt resistor serving as a passive element, the amount of heat generated can be significantly reduced as compared with the case in which the current-voltage conversion is executed by the operational amplifier serving as an active element, and a decrease in the degree of vacuum can be prevented.

FIG. 11 illustrates an example of mounting the signal transmission circuit according to the present embodiment on the circuit board. The wiring and the shunt resistor 150 serving as a passive element are disposed on the circuit board 103 disposed in the vacuum environment, and heat generated from elements on the circuit board 103 is minimized. Although omitted in the circuit diagram in FIG. 10, the ground wiring (ground potential) 144*b* on the circuit board 103 is also drawn to the atmospheric environment through the feedthrough, and is connected to the ground potential 144*a* in the atmospheric environment as described above.

REFERENCE SIGNS LIST

100: central axis
101: pole piece
102: electron beam
103: circuit board
104: SiPM
105: light receiving surface of SiPM
106: light guide
107: scintillator
108: sample
109: back scattered electron (BSE)
110: wiring
111: semiconductor inspection device
112: vacuum housing
113: electron source
114: condenser lens

115: diaphragm
116: reflection plate
117, 118: secondary electron
119: secondary electron detector
120: signal amplifier
121: objective lens
122: deflector
123: BSE detector
124: stage
125: analog-to-digital conversion circuit
126: control device
127: inspection control device
127A: defect analysis unit
127B: 2D contour calculation unit
128: display device
129: semiconductor measurement device
130: measurement control device
130A: dimension measurement unit
130B: inter-pattern matching measurement unit
132: conductive material
133: housing
134: housing potential setting power supply
136: sample height sensor
137: laser light
138: current signal
139: voltage signal
140: wiring
141: vacuum flange
142: feedthrough
143: coaxial wiring
144: ground potential
145: input resistor
146: amplifier
147: bias power supply
148: transimpedance amplifier
149: operational amplifier
150: shunt resistor
400, 401: waveform
501: groove

The invention claimed is:

1. A charged particle beam device comprising:
a stage on which a sample is to be placed;
a charged particle optical system including a charged particle source and an objective lens configured to focus a charged particle beam from the charged particle source onto the sample; and
a detector disposed between the objective lens and the stage and configured to detect electrons emitted by an interaction between the charged particle beam and the sample, wherein
the stage, the charged particle optical system, and the detector are housed in a vacuum housing,
the detector includes a scintillator, a solid-state photomultiplier tube, and a light guide provided between the scintillator and the solid-state photomultiplier tube, and an area of a light receiving surface of the scintillator is larger than an area of a light receiving surface of the solid-state photomultiplier tube,
the charged particle beam device further comprises:
a conductive housing configured to house the detector with the light receiving surface of the scintillator of the detector exposed; and
a housing potential setting power supply configured to apply a predetermined voltage to the conductive housing,
a surface of the scintillator of the detector is coated with a conductive material,
the conductive housing and the conductive material are electrically connected, and
focus adjustment of the charged particle beam from the charged particle optical system is executed by controlling the voltage to be applied to the conductive housing.

2. The charged particle beam device according to claim 1, wherein
the light receiving surface of the scintillator is provided substantially parallel to the light receiving surface of the solid-state photomultiplier tube.

3. The charged particle beam device according to claim 2, wherein
the light guide has a tapered shape.

4. The charged particle beam device according to claim 2, wherein
the detector includes a plurality of the solid-state photomultiplier tubes,
the scintillator has a circular shape centered on a central axis, and
in a surface of the light guide in contact with the plurality of the solid-state photomultiplier tubes, light receiving surfaces of the plurality of the solid-state photomultiplier tubes are rotationally symmetrical with the central axis as a rotation axis.

5. The charged particle beam device according to claim 4, wherein
the light guide is a light guide implemented by combining a plurality of partial light guides corresponding to the plurality of the solid-state photomultiplier tubes.

6. The charged particle beam device according to claim 4, wherein
the light guide is integrally formed, and is separated by a groove into light guides corresponding to the plurality of the solid-state photomultiplier tubes.

7. The charged particle beam device according to claim 6, wherein
the groove is a V-shaped groove.

8. The charged particle beam device according to claim 4, wherein
the detector is provided with a central hole for the charged particle beam from the charged particle optical system to pass therethrough, with the central axis as a center.

9. A charged particle beam device comprising:
a stage on which a sample is to be placed;
a charged particle optical system including a charged particle source and an objective lens configured to focus a charged particle beam from the charged particle source onto the sample; and
a detector disposed between the objective lens and the stage and configured to detect electrons emitted by an interaction between the charged particle beam and the sample, wherein
the stage, the charged particle optical system, and the detector are housed in a vacuum housing,
the detector includes a scintillator, a solid-state photomultiplier tube, and a light guide provided between the scintillator and the solid-state photomultiplier tube, and an area of a light receiving surface of the scintillator is larger than an area of a light receiving surface of the solid-state photomultiplier tube,
the detector includes a circuit board on which a first resistor is mounted,
one end of the first resistor is connected to an output terminal of the solid-state photomultiplier tube and the other end is connected to a first ground potential, and the output terminal of the solid-state photomultiplier tube is connected to one end of a coaxial wiring, and the other end of the coaxial wiring is drawn out of the vacuum housing.

10. The charged particle beam device according to claim 9, wherein the other end of the coaxial wiring is connected to a signal amplifier and one end of and a second resistor, the other end of the second resistor is connected to a second ground potential, and the first ground potential and the second ground potential are electrically connected to each other to have the same potential.

* * * * *